(12) United States Patent
Kao et al.

(10) Patent No.: US 7,481,704 B2
(45) Date of Patent: Jan. 27, 2009

(54) FAN RACK FIXTURE HAVING TWO PAIRS OF POSITIONING AND LOCKING PORTIONS

(75) Inventors: Kuang-Yi Kao, Taipei (TW); Lin-Wei Chang, Taipei (TW); Chi-Kang Hsieh, Taipei (TW)

(73) Assignee: Inventec Corporation, Taipei (TW)

( * ) Notice: Subject to any disclaimer, the term of this patent is extended or adjusted under 35 U.S.C. 154(b) by 414 days.

(21) Appl. No.: 11/301,965

(22) Filed: Dec. 12, 2005

(65) Prior Publication Data

US 2007/0135033 A1 Jun. 14, 2007

(51) Int. Cl.
*H05K 7/20* (2006.01)
(52) U.S. Cl. .................... 454/184; 361/695; 415/213.1; 415/214.1; 417/360
(58) Field of Classification Search ......... 361/694–697, 361/688–691, 676–678; 454/184; 415/213.1, 415/214.1; 165/80.3; 174/16.1; 417/360
See application file for complete search history.

(56) References Cited

U.S. PATENT DOCUMENTS 6,183,214 B1* 2/2001 Ko .............................. 361/695
6,213,819 B1* 4/2001 Fan ............................. 361/695
6,236,564 B1* 5/2001 Fan ............................. 361/695
2001/0008480 A1* 7/2001 Huang ......................... 361/687

FOREIGN PATENT DOCUMENTS

| TW | 584264 | 1/1992 |
| TW | 584246 | 5/1992 |

* cited by examiner

*Primary Examiner*—Philip H Leung
(74) *Attorney, Agent, or Firm*—Jianq Chyun IP Office

(57) ABSTRACT

A fan rack fixture for fixing a fan rack to a housing of an electronic device is disclosed. The fan rack fixture includes a first positioning portion installed on a first side of the fan rack, a first locking portion installed on a first side of the housing for fixing the first positioning portion, a second positioning portion installed on a second side of the fan rack and opposite to the first positioning portion, and a second locking portion installed on a second side of the housing for fixing the second positioning portion. By virtue of the fan rack fixture, the fan rack can be assembled/disassembled to/from the housing of the electronic device, even without the use of any tool.

9 Claims, 10 Drawing Sheets

FAN RACK FIXTURE HAVING TWO PAIRS OF POSITIONING AND LOCKING PORTIONS

BACKGROUND OF THE INVENTION

1. Field of the Invention

The present invention relates generally to a fan rack, and more particularly, to a fan rack fixture having two pairs of positioning and locking portions for fixing a fan rack to a housing of an electronic device.

2. Description of Related Art

With rapid development of electronic products, people's life is becoming more and more comfortable by such various electronic devices. Specially, computer industry is making an increasing progress with the work frequency, which easily increases the temperature of the electronic components (for example, CPU, hard disk, display card and so on). Therefore, a pocket fan has become one of the most popular heat sinks and has been widely applied in an electronic device, e.g., a computer, a server and the like.

Taken the application in server for example, Taiwan Patent No. 584,264 proposed a heat dissipating configuration for server, which is configured in an inner part of a host housing, which is divided into a first containing space and a second containing space. The first containing space is used to contain data access device. The second containing space is provided a clapboard, one side of which is configured a mainboard and an intake, and the other side of which is at least provided a heat dissipating configuration. An air vent is installed at the housing of the heat dissipating configuration and is corresponding to the intake. A fan and an airflow structure configured in the housing can dissipate the heat source produced by the mainboard through the intake and air vent.

The above patent proposed a configured structure related to the server, and further proposed a removable fan module for loading fan and airflow structure by the housing, but the removable fan module occupies setting space of the power supply, which is no doubt to decrease the extended function for the server. Furthermore, in order to maintain setting space and the corresponding number for the power supply, the integral width of the server must be increased, which departs from the developing trend for miniaturization of various electronic devices, and due to the addition of width, it can not be applied in a machine cabinet or modular machine room with general specifications, universality of the product is relatively deduced.

Taiwan Patent No. 584,246 proposed another fast fan rack fixture for heat dissipating fan of the server, the fan rack fixture includes fixing base that is stenciled in the center, the stenciled is divided into at least a containing chamber with suitable space through a clapboard, the containing chambers is respectively provided through holes that are opposite to one another at the surface of the both opposite side walls in the base, and at least one heat dissipating fan can be respectively placed in the containing chambers exactly. Meanwhile, making the uptake exactly opposite to the through hole, and respectively disposing a fixing component that is able of tabling quickly at the vertical cross in one side of the adjacent clapboard, a locating groove is formed by the fixing components and one side wall surface of the fixing base, then by virtue of the locating groove of the fixing base, the fan can be directly tumbled in at least one the other fixing component installed at the corresponding position of a server housing, thereby the effect for disassembling and assembling the heat dissipating fans quickly can be obtained.

The fixing components are composed of slim vertical spring arms, a pulling portion is installed vertical to the direction of the locating groove on the top of the spring arms, the side wall of the spring arms towards the direction of the locating groove and corresponding to one side wall of the fixing base are respectively provided bulges that are opposite to one another. The other fixing components are composed of vertical hollow locating posts with U-shaped portion, both side walls of the locating post are provided a locating hole. The other fixing components can be installed on the housing of server, and between the interface circuit board and a rectifier before a power supply.

The above patent proposes a fixing base (fan rack) for disposing a plurality of heat dissipating fans, the fixing base and the housing of the server are assembled and disassembled through the fixing components installed at the relative positions of the fixing base and the housing of the server. Although the above patent has provided the assembling and disassembling design for the fixing base, structures of the fixing component and the other fixing component are too complex, and aligning steps for assembly are also not easy, specially, the inner of the server housing are full of many setting components and layouts, it is quite difficult and inconvenient to disassemble and assemble whether using tools or not in the limited space of the inner of the server housing, thus, it is needed improving.

In addition, if the above-discussed fixing component is changed to the screw locking design, additional tools are required employing to lock or withdraw the screws when assembling or disassembling the fixing base, which makes the assembling and disassembling process waste long time, during the assembling process, it tends to affect by the circumstance and cause that the screws are dropped to the inner of the server housing or lost, thereby resulting in the process for assembling and disassembling inconveniently and slowly.

Accordingly, there exists a strong need in the art for a fan rack fixture, so as to assemble and disassemble quickly and conveniently without tools.

SUMMARY OF THE INVENTION

Accordingly, it is a primary objective of the present invention to solve the drawbacks of the aforementioned conventional technology by providing a fan rack fixture, which is capable of assembling/disassembling a fan rack to/from a housing of an electronic device even without any tool.

It is another objective of the present invention to provide a fan rack fixture, which is capable of assembling/disassembling the fan rack to/from the housing of the electronic device quickly and conveniently.

In order to attain the object mentioned above and the others, a fan rack fixture for fixing a fan rack to a housing of an electronic device is provided according to the present invention. The fan rack fixture includes a first positioning portion installed on a first side of the fan rack, a first locking portion installed on a first side of the housing for fixing the first positioning portion, a second positioning portion installed on a second side of the fan rack and opposite to the first positioning portion, and a second locking portion installed on a second side of the housing for fixing the second positioning portion. By virtue of the fan rack fixture, the fan rack can be assembled/disassembled to/from the housing of the electronic device, even without the use of any tool.

Preferably, the first positioning portion includes an L-shaped sheet, and the first locking portion includes a first opening for fixing the L-shaped sheet of the first positioning portion, the first opening having a width larger than a thickness of the L-shaped sheet. The second positioning portion includes a hook and a second opening. The second locking portion includes a slot and a jack. The fan rack fixture further includes a spring portion and an adjusting portion. Preferably, the spring portion is a leaf spring, and has a limiting stopper. The limiting stopper can be a bulge or has other equivalent structures. The adjusting portion includes an adjusting opening for the spring portion to pass, and a movable opening installed adjacent to the adjusting opening.

Compared with the prior art, the fan rack fixture according to the present invention does not employ any tools when assembling/disassembling a fan rack to/from a housing of an electronic device. That is, the assembly/disassembly of the fan rack to/from the housing of the electronic device can be completed manually, thereby solving the problems, such that structures of the fixing component and the other fixing component are too complex, and aligning steps for assembly are also not easy, specially, the inner of the server housing are full of many setting components and layouts, it is quite difficult and inconvenient to disassemble and assemble in the limited space of the inner of the server housing, in the conventional technology.

Applications of the present invention can assemble and disassemble quickly and conveniently merely by using simply operation, thereby solving the drawbacks, such that additional tools are required employing to lock or withdraw screws, which makes the assembling and disassembling process waste long time, during the assembling process, it tends to affect by the circumstance and cause that the screws are dropped to the inner of the server housing or lost, thereby resulting in the process for assembling and disassembling inconveniently and slowly, in the conventional technology.

Moreover, the present invention can be applied in fan rack, electronic device and its housing with the existing specifications, thereby avoiding the problems, such that in order to maintain setting space and the corresponding number for the power supply, the integral width of the server must be increased, which departs from the developing trend for miniaturization of various electronic devices, and due to the addition of width, it can not be applied in a machine cabinet or modular machine room with general specifications, universality of the product is relatively deduced, in the conventional technology. Furthermore, the present invention can be applied in fan rack, electronic device and housing with the existing and new specifications, it has much more spring in design.

As described above, the fan rack fixture according to the present invention can assemble and disassemble quickly and conveniently without tools, so as to solve various drawbacks of the conventional technology, which makes the present invention have significantly high value in use of the industry.

BRIEF DESCRIPTION OF DRAWINGS

FIGS. 4A and 4B depict schematic diagrams of local amplification of the second positioning portion in FIG. 1A, wherein, FIG. 4A depicts the second positioning portion that has already bonded to the spring portion but not yet installed the adjusting portion, FIG. 4B depicts the second positioning portion that has already bonded to the spring portion and installed the adjusting portion.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be devised without departing from the spirit of the present invention.

Figure 1A:
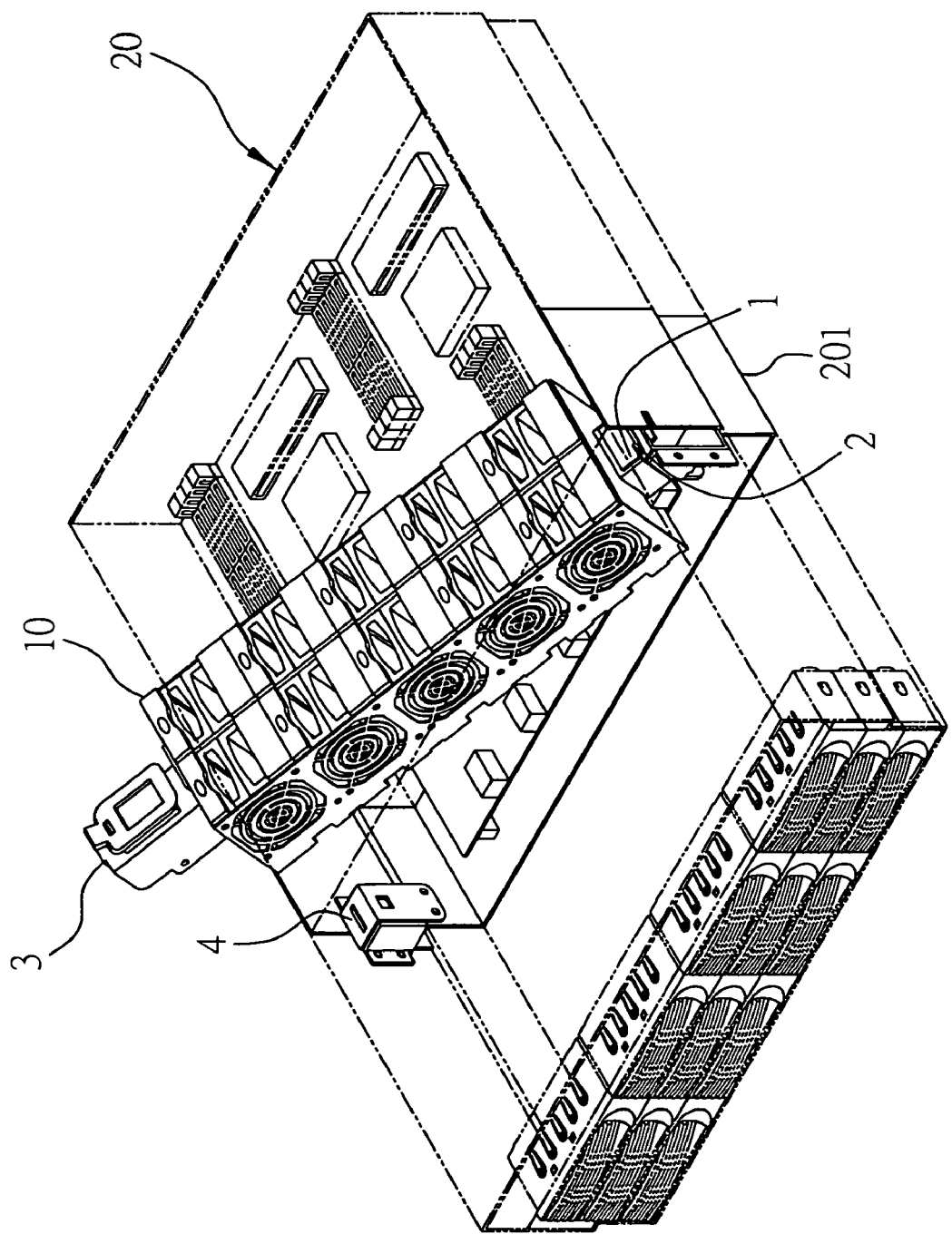
FIG. 1A is a schematic diagram of a fan rack fixture of the preferred embodiment and a fan rack and an electronic device, the fan rack being fixed to a housing of the electronic device by the fan rack fixture, according to the present invention.
Figure 1B:
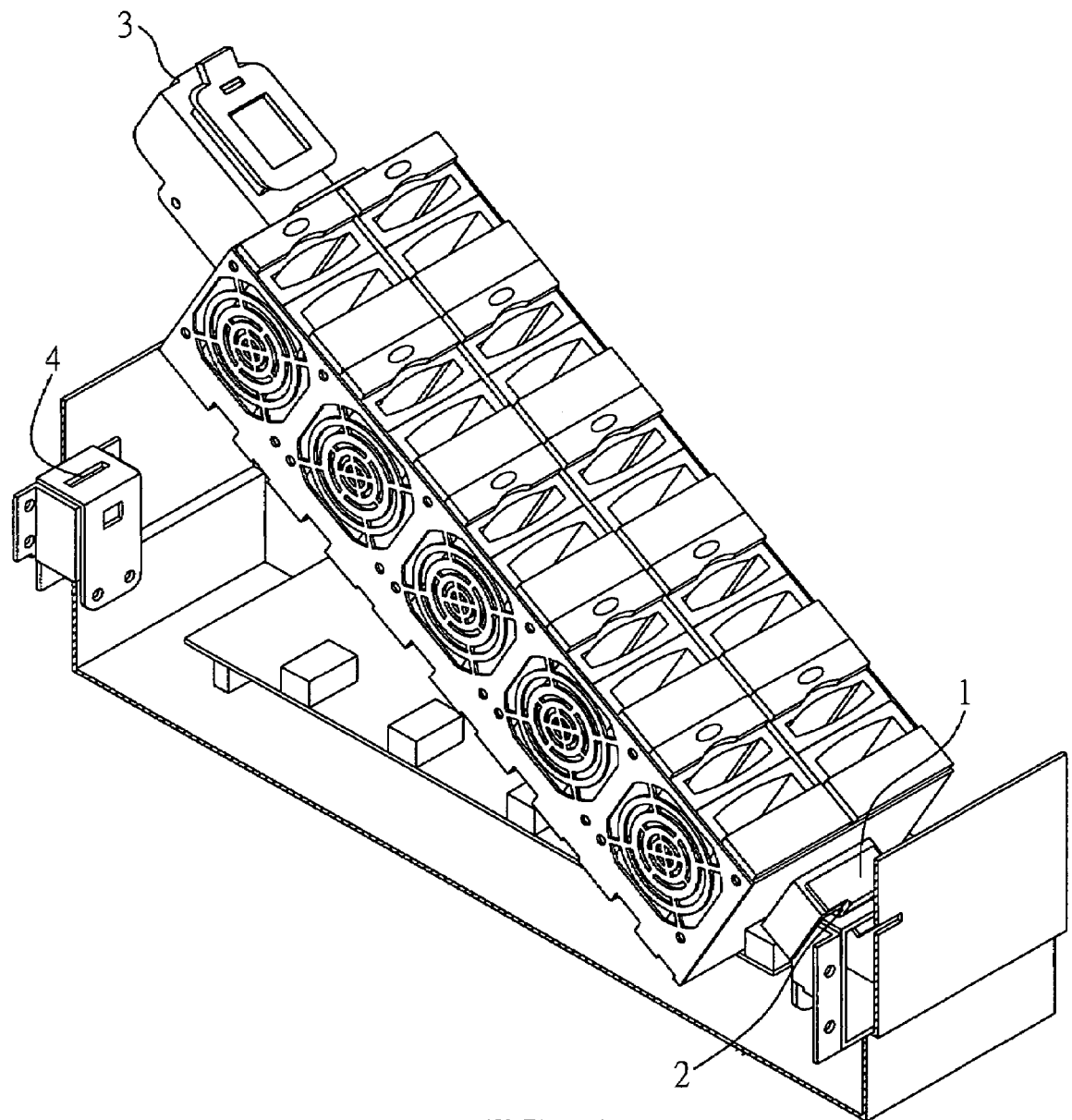
FIG. 1B is an explosive view of the fan rack fixture and the fan rack shown in FIG. 1A.

FIG. 1A is a schematic diagram of a fan rack fixture of the preferred embodiment and a fan rack 10 and an electronic device 20, the fan rack 10 being fixed to a housing 201 of the electronic device 20 by the fan rack fixture, according to the present invention. FIG. 1B is an explosive view of the fan rack fixture and the fan rack 10. As shown in FIG. 1A, the fan rack fixture according to the present invention is used to fix the fan rack 20 to the housing 201 of the electronic device 20. Since the fan rack 10, the electronic device 20 and the housing 201 can be different from one another according to the application, fan rack, electronic device and housing applied in the present invention can be the exiting specification or other new design, and they can be all conventional but they are not the feature of the present invention. Thus, in order to illustrate features of the present invention in a more clear and concise manner, merely the components that are directly related to the present invention are displayed in the drawings, the others are left out, and structure, number, shape and proportion of size of the fan rack 10, electronic device 20 and housing 201 illustrated in the drawings are not used to limit the present invention, layout of the components may be more complex when actually implementing.

The fan rack fixture comprises a first positioning portion 1, a first locking portion 2, a second positioning portion 3 and a second locking portion 4.

Figure 2:
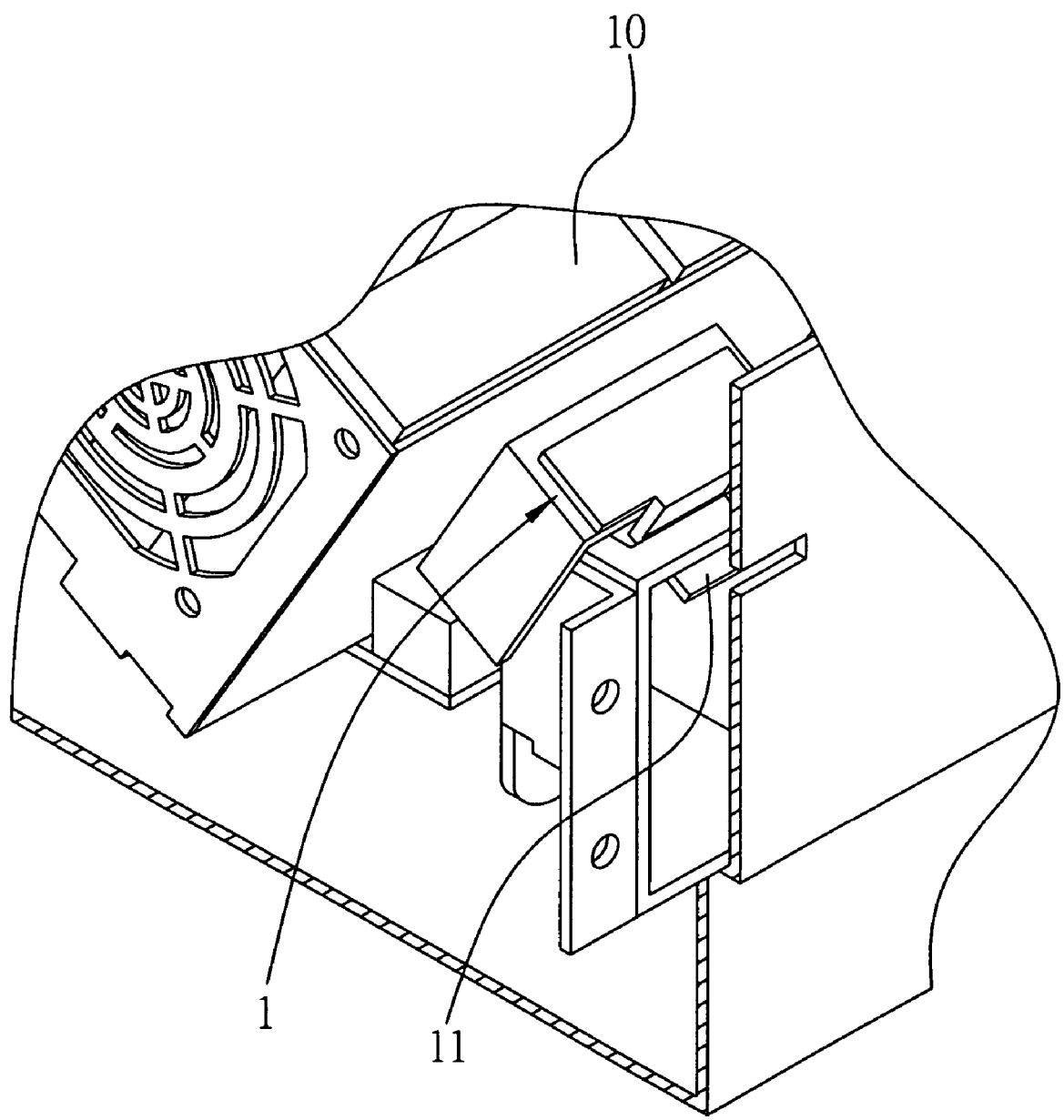
FIG. 2 is an explosive view of a first positioning portion of the fan rack fixture shown in FIG. 1B.

Please refer to FIG. 2, which is an explosive view of the first positioning portion 1 of the fan rack fixture. The first positioning portion 1 is installed on a first side of the fan rack 10, and comprises an L-shaped sheet 11.

Figure 3:
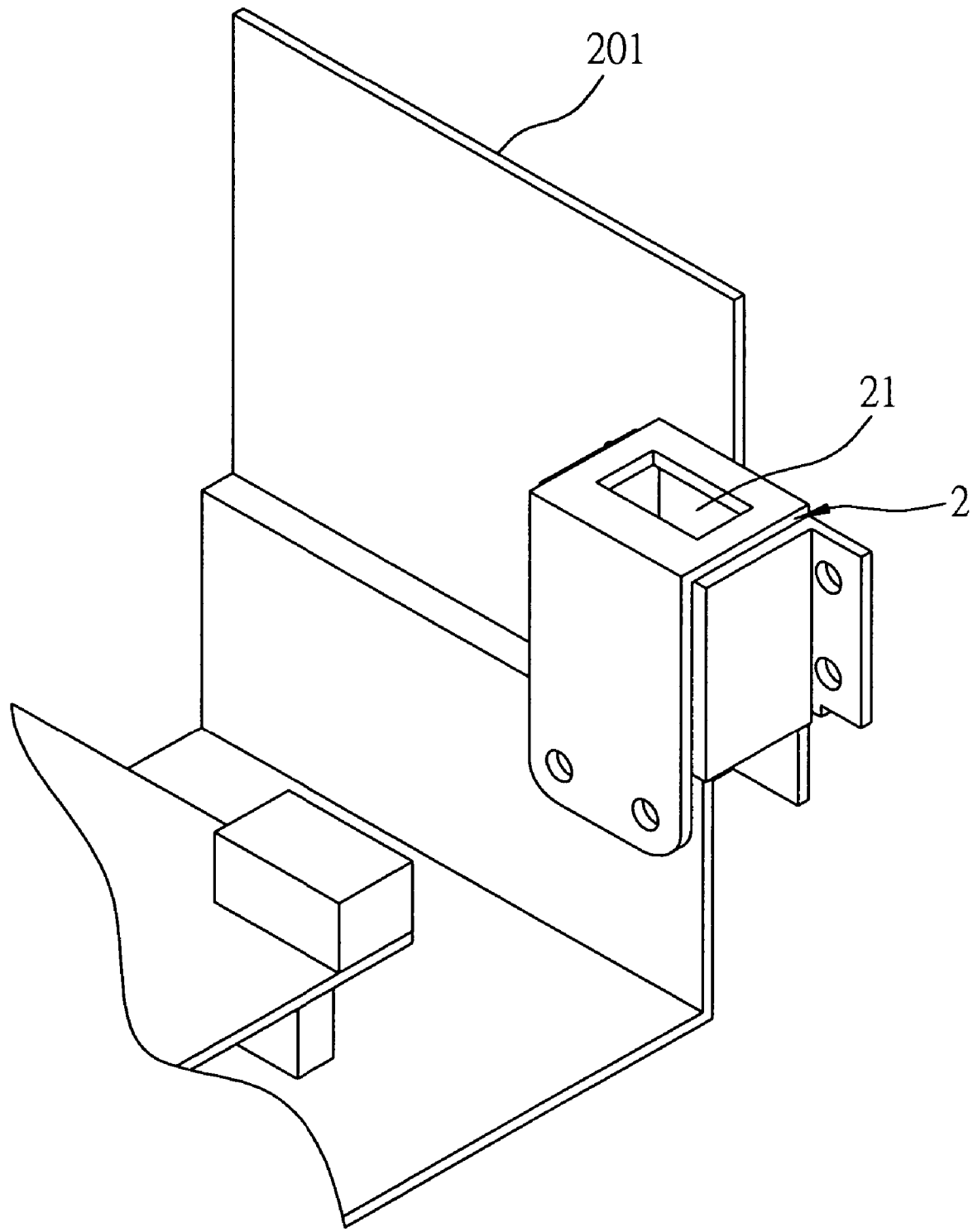
FIG. 3 is an explosive view of a first locking portion of the fan rack fixture shown in FIG. 1B.

Please refer to FIG. 3, which is an explosive view of the first locking portion 2 of the fan rack fixture. The first locking portion 2 is installed on a first side of the housing 201, and comprises a first opening 21 for fixing the L-shaped sheet 11 of the first positioning portion 1. The first opening 21 has a width larger than a thickness of the L-shaped sheet 11.

Figure 4A:
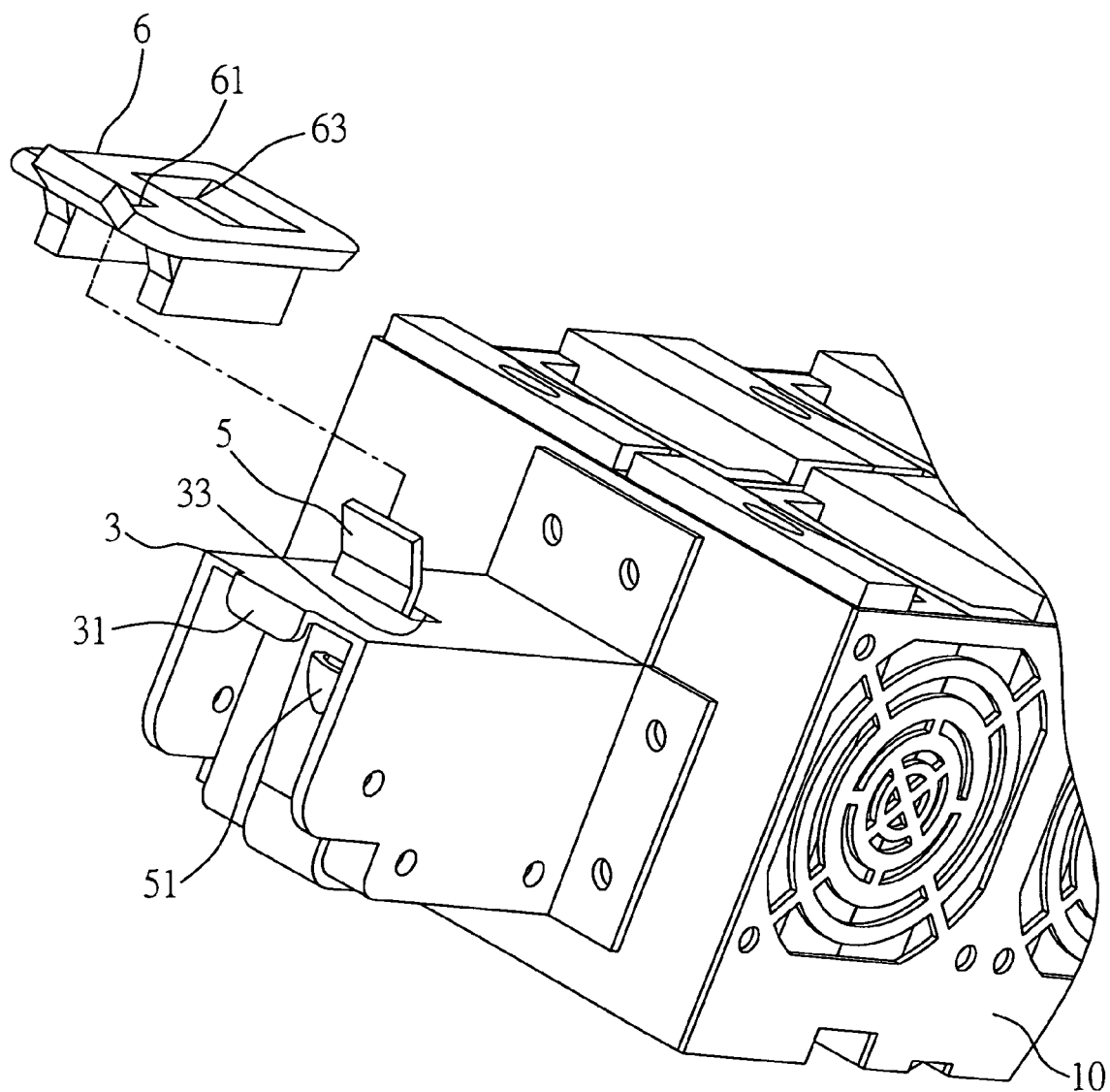
Figure 4B:
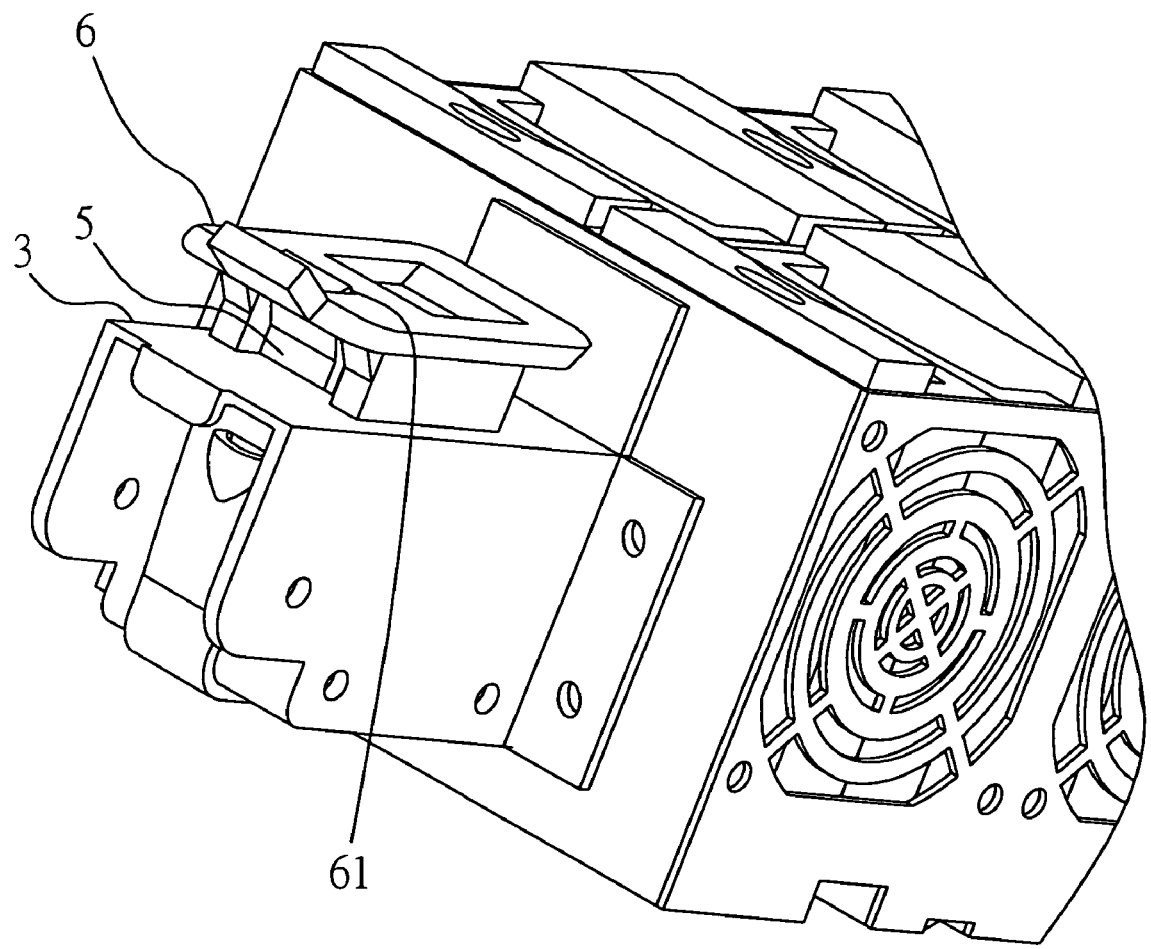

With reference to FIG. 4A in conjunction with FIG. 1B, the second positioning portion 3 is installed on a second side of the fan rack 10 and opposite to the first positioning portion 1. The second positioning portion 3 comprises a hook 31 and a second opening 33. As shown in FIG. 4A, the fan rack fixture further comprises a spring portion 5 and an adjusting portion 6. The spring portion 5 is allowed to pass through the second opening 33 and is installed on the second positioning portion 3. A width of the second opening 33 is larger than a thickness of the spring portion 5. The spring portion 5 is, e.g., a leaf spring and comprises a limiting stopper 51. The limiting stopper 51 is, e.g., a bulge. The adjusting portion 6 is allowed to pass through a part of the spring portion 5 that is protruded from the second positioning portion 3, and is installed on the second positioning portion 3. The adjusting portion 6 comprises an adjusting opening 61 for the spring portion 5 to pass, and a movable opening 63 installed adjacent to the adjusting opening 61 for insertion of men's fingers. When the adjusting portion 6 is installed on the second positioning portion 3, as shown in FIG. 4B, the adjusting opening 61 can fix the spring portion 5, thereby fixing the adjusting portion 6 to the second positioning portion 3.

Figure 5A:
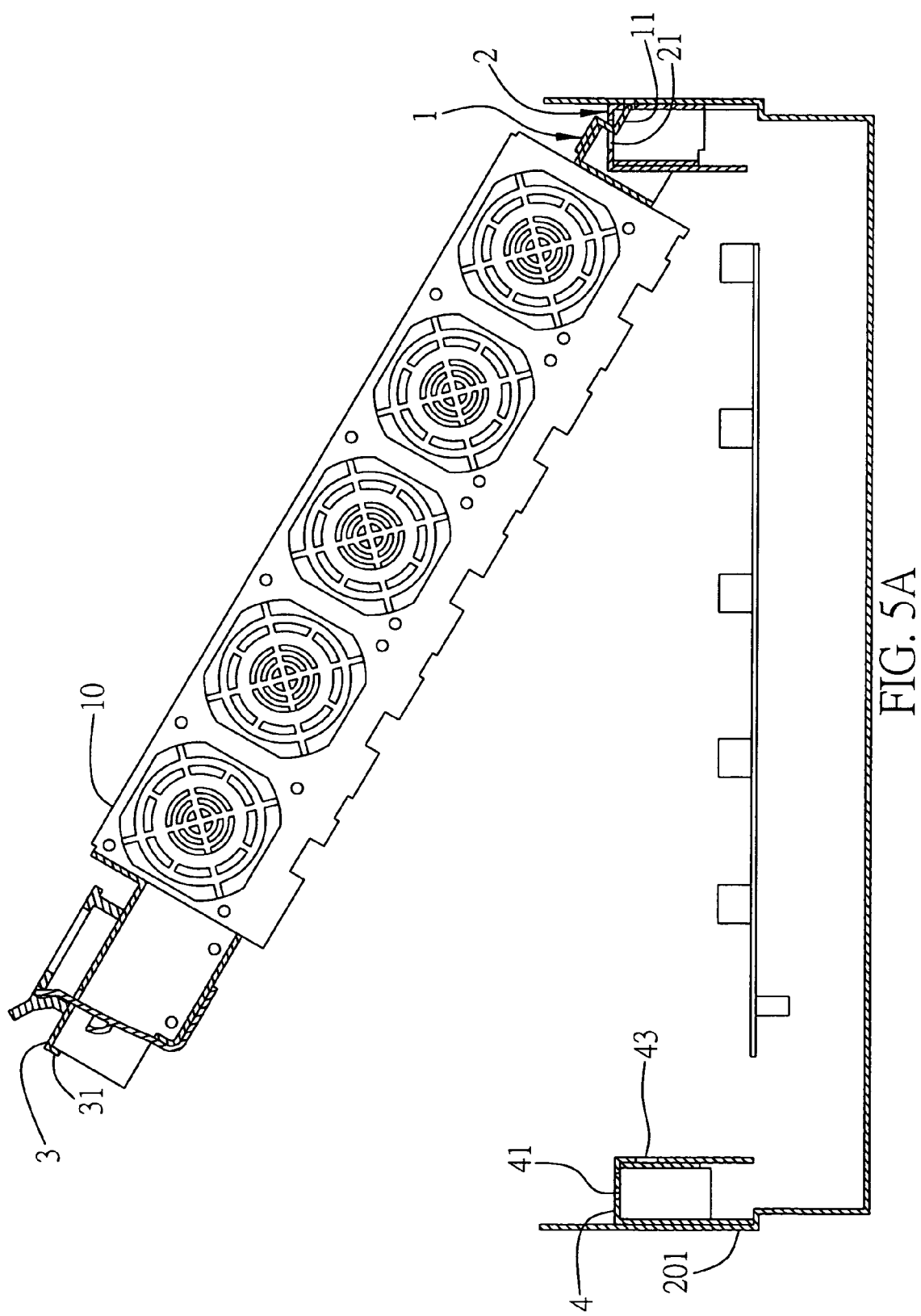
FIGS. 5A and 5B depict schematic diagrams of that the preferred embodiment of the fan rack fixture according to the present invention is applied to mount the fan rack on the housing of the electronic device.

With reference to FIG. 5A in conjunction with FIG. 1B, the second locking portion 4 is installed at a second side of the housing 201 for fixing the second positioning portion 3. The second locking portion 4 comprises a slot 41 for the hook 31 to be inserted into, and a jack 43 for the limiting stopper 51 to be inserted into, thereby fixing the fan rack 10 to the housing 201.

It should be noted that the first opening 21, the second opening 33, the adjusting opening 61, the movable opening 63, the slot 41 and the jack 43 in the preferred embodiment are all assumed to have a rectangular structure, but which can be changed in the other embodiment. Certainly, the part that is correspondingly bonded to or fixed the above opening, slot or jack should be changed correspondingly, which are easy for those skilled in the art to change, so it will not be described accompanying the drawings again.

Figure 5B:
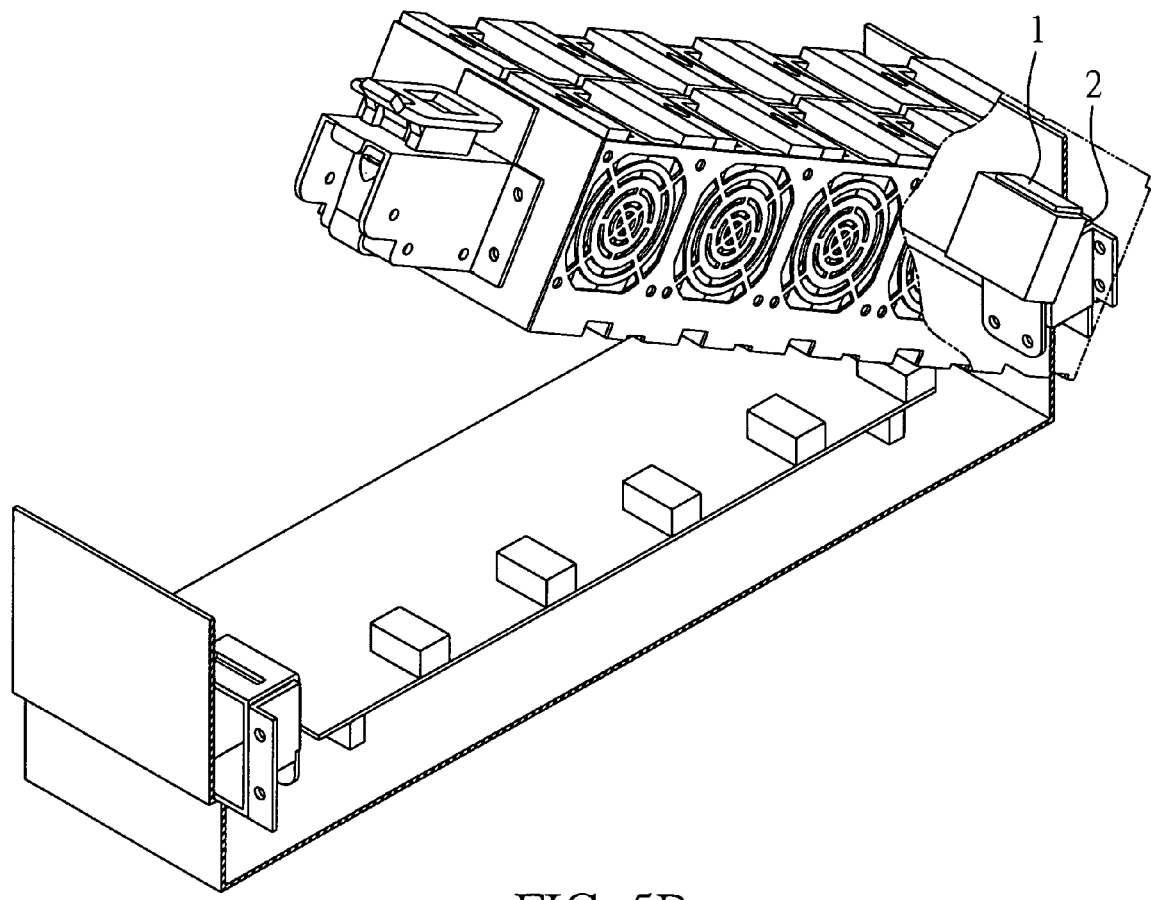
Figure 6:
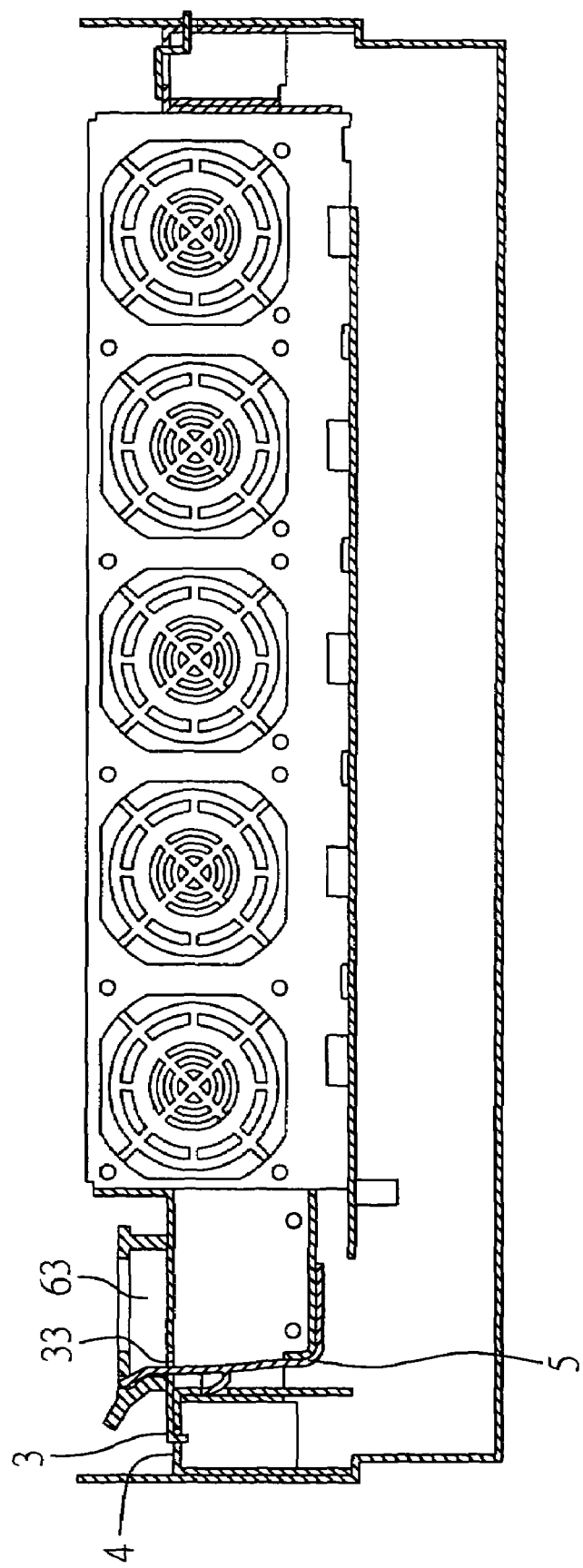
FIG. 6 depicts a schematic diagram of that the fan rack has been mounted on the housing of the electronic device by virtue of the fan rack fixture.

When the fan rack 10 is needed to be fixed to the housing 201 of the electronic device 20, as shown in FIG. 5A in conjunction with FIG. 5B, the L-shaped sheet 11 of the first positioning portion 1 is inserted into the opening 21 of the first locking portion 2 first; meanwhile, since the width of the first opening 21 is larger than the thickness of the L-shaped sheet 11, the first positioning portion 1 can be flexed downwards by adopting the first locking portion 2 as a fulcrum. Then, the second positioning portion 3 is fixed to the second locking portion 4, and the hook 31 is inserted into the slot 41, so as to restrict the fan rack 10 from moving leftward or leftward, and the limiting stopper 51 is inserted into the jack 43, so as to restrict the fan rack 10 from moving upward or downward. In result, as shown in FIG. 6, the second positioning portion 3 is fixed to the second locking portion 4, and the spring portion 5 is use to compensate the location, so as to make the location more steady. Certainly, a shape of the limiting stopper 51 is not limited to this, any structure that can be correspondingly inserted into the jack 43 and make the fan rack 10 can not move up and down is permitted, in order to simplify the structure, the limiting stopper 51 can even be left out, which is not limited to what described in the embodiment.

Accordingly, through fixing the first positioning portion 1 to the first locking portion 2 and fixing the second positioning portion 1 to the second locking portion 2, the fan rack 10 can be fixed to the housing 201 of the electronic device 20.

Figure 7:
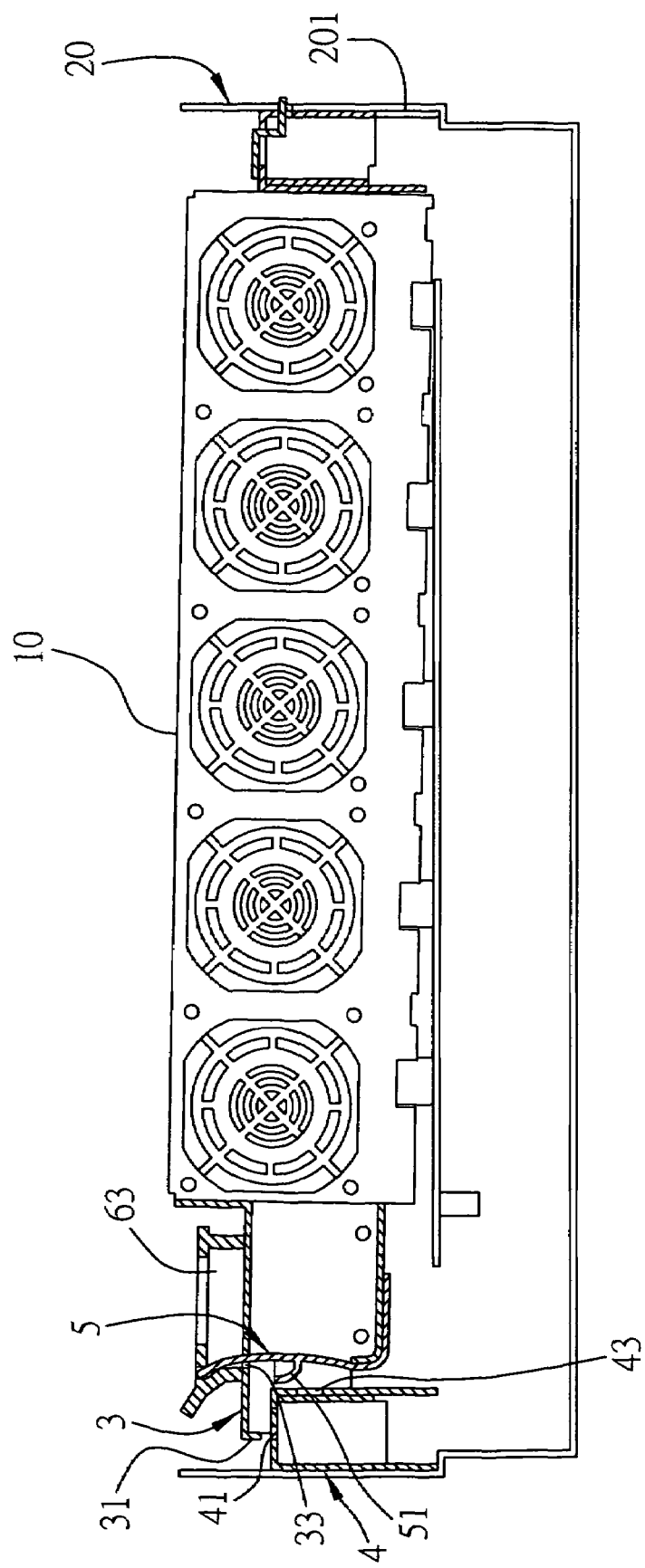
FIG. 7 depicts a schematic diagram of that the fan rack fixture is disassembled from the housing of the electronic device.

When the fan rack 10 is needed to be disassembled from the housing 201 of the electronic device 20, as shown in FIG. 7 in conjunction with FIG. 6, since the width of the second opening 33 is larger than the thickness of the spring portion 5, the fingers are allowed to insert into the movable opening 63 of the adjusting portion 6 and move towards the fan rack 10, so as to make the limiting stopper 51 of the spring portion 5 depart from the jack 43, and then make the hook 31 depart from the slot 41. Therefore, a fixing state between the second positioning portion 3 and the second locking portion 4 can be relieved. After the second side of the fan rack 10 is lifted, where the second positioning portion 3 is installed, the fan rack 10 is disassembled from the housing 210 of the electronic device 20, and the fixing state between the first positioning portion 1 and the first locking portion 2 is relieved, thereby disassembling the fan rack 10 from the housing 201.

Compared with the prior art, the fan rack fixture according to the present invention can perform operation of assembly and disassembly without tools, thereby solving the problems, such that structures are too complex, and aligning steps for assembly are also quite difficult, specially, the inner of the server housing are full of setting components and layouts, it is quite difficult and inconvenient to disassemble and assemble in the limited space of the inner of the server housing, in the conventional technology.

Meanwhile, application of the present invention can assemble and disassemble quickly and conveniently merely by using simply operation, thereby solving the drawbacks, such that additional tools are required employing to lock or withdraw screws, which makes the assembling and disassembling process waste long time, during the assembling process, it tends to affect by the circumstance and cause that the screws are dropped to the inner of the server housing or lost, thereby resulting in the process for assembling and disassembling inconveniently and slowly, in the conventional technology.

In addition, the present invention can be applied in fan rack, electronic device and its housing with the existing specifications, thereby avoiding the problems, such that in order to maintain setting space and the corresponding number for the power supply, the integral width of the server must be increased, which departs from the developing trend for miniaturization of various electronic devices and causes that the server can not be applied in a machine cabinet or modular machine room with general specifications, universality of the product is relatively deduced, in the conventional technology. Furthermore, the present invention can be applied in fan rack, electronic device and its housing not only with the existing specifications, but also with new design specifications, the present invention in deed has much more spring in design than the conventional technology.

Therefore, the fan rack fixture according to the present invention in deed can solve various drawbacks of the conventional technology, operation of assembly and disassembly can be performed without tools by applying the present invention, and such operation also can be performed quickly and conveniently, which makes the present invention have significantly high value in use of the industry.

What described above is to describe the exemplary preferred embodiment of the fan rack fixture according to the present invention, it is not limited the scope of the essential technical content according to the present invention, the essential technical content is broadly defined in the appended claim, if the exemplary embodiments or method implemented by any one are completely identical to the following claim or only an equivalent change of the following claim, all that is considered to fall with the scope of the invention.

What is claimed is:

1. A fan rack fixture for fixing a fan rack to a housing of an electronic device, the fan rack fixture comprising:
    a first positioning portion installed on a first side of the fan rack, wherein the first positioning portion comprises an L-shaped sheet;
    a first locking portion installed on a first side of the housing for fixing the first positioning portion;
    a second positioning portion installed on a second side of the fan rack and opposite to the first positioning portion;

a second locking portion installed on a second side of the housing for fixing the second positioning portion;

a spring portion installed on the second positioning portion; and an adjusting portion movably installed on the second positioning portion, the adjusting portion comprising:
  an adjusting opening for the spring portion to pass through; and
  a movable opening installed adjacent to the adjusting opening.

2. The fan rack fixture of claim 1, wherein the first locking portion comprises a first opening corresponding to the L-shaped sheet of the first positioning portion for fixing the L-shaped sheet.

3. The fan rack fixture of claim 2, wherein the first opening has a width larger than a thickness of the L-shaped sheet.

4. The fan rack fixture of claim 1, wherein the second positioning portion comprises a hook and a second opening.

5. The fan rack fixture of claim 1, wherein the second locking portion comprises a slot and a jack.

6. The fan rack fixture of claim 1, wherein the spring portion is a leaf spring.

7. The fan rack fixture of claim 1, wherein the spring portion comprises a limiting stopper.

8. The fan rack fixture of claim 7, wherein the limiting stopper is a bulge.

9. A fan rack fixture for fixing a fan rack to a housing of an electronic device, the fan rack fixture comprising:

a first positioning portion installed on a first side of the fan rack, wherein the first positioning portion comprises an L-shaped sheet;

a first locking portion installed on a first side of the housing for fixing the first positioning portion, the first locking portion comprising a first opening corresponding to the L-shaped sheet of the first positioning portion, wherein the L-shaped sheet is suitable for passing through the first opening and extending under the first locking portion so as to be fixed by the first locking portion, and the first opening has a width larger than a thickness of the L-shaped sheet;

a second positioning portion installed on a second side of the fan rack and opposite to the first positioning portion, the second positioning portion comprising a hook and a second opening;

a second locking portion installed on a second side of the housing for fixing the second positioning portion, the second locking portion comprising a slot and a jack, wherein the hook is suitable for being inserted into the slot so as to restrict the fan rack from moving leftward or rightward;

a spring portion installed on the second positioning portion and passing through the second opening, the spring portion comprising a limiting stopper suitable for being inserted into the jack so as to restrict the fan rack from moving upward or downward; and an adjusting portion movably installed on the second positioning portion, the adjusting portion comprising:
  an adjusting opening for the spring portion to pass through; and
  a movable opening installed adjacent to the adjusting opening.

* * * * *